United States Patent [19]

Nootbaar

[11] Patent Number: 4,801,820
[45] Date of Patent: Jan. 31, 1989

[54] LSI ARRAY HAVING POWER DOWN CAPABILITY

[75] Inventor: Keith D. Nootbaar, San Diego, Calif.

[73] Assignee: Motorola, Inc., Schaumburg, Ill.

[21] Appl. No.: 858,788

[22] Filed: May 2, 1986

[51] Int. Cl.[4] .................. H03K 3/01; H03K 17/16; H03K 19/173

[52] U.S. Cl. .................. 307/296R; 307/303; 307/443; 307/465; 307/467

[58] Field of Search .............. 307/465.1, 303.1, 467, 307/296 R, 297, 443

[56] References Cited

U.S. PATENT DOCUMENTS 4,357,687 11/1982 Rufford .................. 365/227

FOREIGN PATENT DOCUMENTS 0167894 9/1984 Japan .................. 365/227
0160885 9/1984 Japan .................. 365/227

Primary Examiner—John S. Heyman
Assistant Examiner—M. R. Wambach
Attorney, Agent, or Firm—William E. Koch

[57] ABSTRACT

A large scale integrated array is provided wherein portions of the device may be selectably powered down when not in use. A switching circuit located in the first cell of a row of cells is responsive to a data input signal and receives a voltage from a regulator for providing a substantially similar voltage to the other cells in that row for driving current source devices therein.

19 Claims, 1 Drawing Sheet

LSI ARRAY HAVING POWER DOWN CAPABILITY

FIELD OF THE INVENTION

This invention relates in general to an integrated circuit (IC) device and, more particularly, to a gate array IC device or a master slice Large Scale Integrated (LSI) device in which portions of the device may be powered down when not in use.

BACKGROUND OF THE INVENTION

To satisfy the demand for large scale digital integrated circuits, the semiconductor industry has developed three basic approaches. These include standard, off the shelf circuits; custom circuits; and gate arrays. The standard, off the shelf circuit provides the lowest cost option due to the quantities manufactured, but are limited in providing the flexibility for the circuit desired. The custom circuit is cost limiting unless the number of circuits desired is large. The gate array involves a standard array of a large number of gate circuits diffused into a chip. The metallization pattern converting these gate circuits into functional custom circuits is processed according to the customer's requirement.

Complex gate arrays may have several gates combined within a cell that performs a higher level logic function than a basic gate. These complex arrays have logic simulations directly implemented within the basic cell structure rather than formed by interconnecting logic gates. Each cell contains a number of unconnected transistors and resistors. A metallization interconnecting pattern transforms the interconnected transistors and resistors within each cell into Small Scale Integrated (SSI) logic functions, which take the form of standard logic elements such as dual type "D" flip-flops, dual full adders, quad latches, and many other predefined functions. These cells are also interconnected by the metallization to form the desired LSI design.

A typical complex gate array comprises at least a plurality of cells located in an inner portion of the IC, input/output pads and power pads around the periphery of the IC, and a regulator at each of the four corners of the IC for providing a current source voltage. These complex gate arrays perform a multitude of functions whenever the proper input signals are applied. However, when the gate array, or a portion of the gate array, is not being used, current is still required to keep the unused portion powered, resulting in an unnecessarily high current requirement.

Thus, what is needed in a gate array IC device or a master slice Large Scale Integrated (LSI) device in which portions of the device may be powered down when not in use.

SUMMARY OF THE INVENTION

Accordingly, it is an object of the present invention to provide an improved gate array.

Another object of the present invention is to provide a gate array in which a portion of the array may be powered down.

A further object of the present invention is to provide a gate array having a circuit within a cell of the array that selectively powers down one or more other cells within the array.

Yet another object of the present invention is to provide a gate array wherein a circuit within a cell of the array that selectively powers down one or more other cells within the array will quickly power up the powered down cells in response to an input signal.

Still another object of the present invention is to provide a gate array in which a portion of the array may be powered down without effecting a regulator supplying current thereto.

In carrying out the above and other objects of the invention in one form, there is provided a large scale integrated array comprising a plurality of pads, a plurality of regulators, each of the regulators supplying a first voltage, and a plurality of cells arranged in a matrix of rows and columns wherein each of the cells comprise a plurality of semiconductor devices. A metallization pattern is coupled between the plurality of pads, the plurality of cells and the plurality of regulators, wherein the metallization pattern connects the plurality of semiconductor devices for performing a plurality of functions. One each of a plurality of power down circuits are located within one of the plurality of cells and are coupled by the metallization pattern between one of the regulators and a portion of the plurality of cells for receiving the first voltage and selectably supplying a second voltage substantially similar to the first voltage to the portion of the plurality of cells, wherein the second voltage is required for the operation of the portion of the plurality of cells.

The above and other objects, features, and advantages of the present invention will be better understood from the following detailed description taken in conjunction with the accompanying drawings.

DETAILED DESCRIPTION OF THE INVENTION

Figure 1:
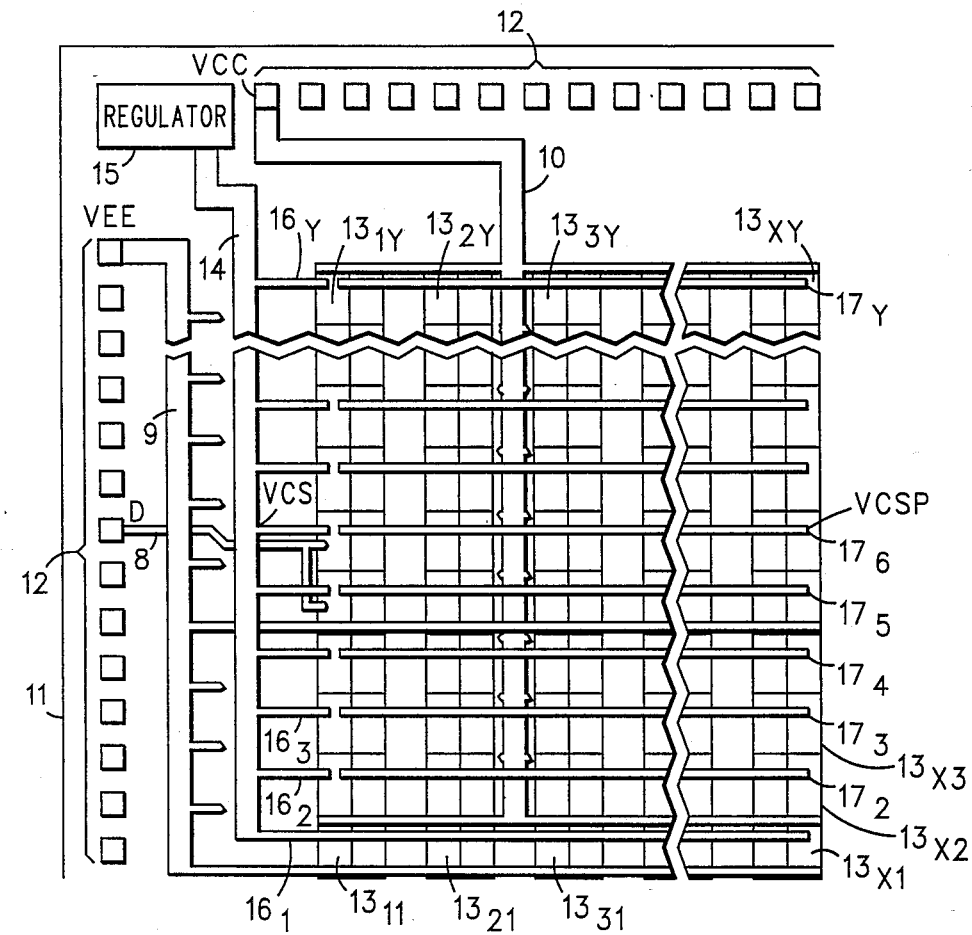
FIG. 1 is a partial schematic view in accordance with the present invention of an integrated circuit array comprising a plurality of cells.

Referring to FIG. 1, a gate array fabricated in monolithic integrated circuit form is shown in accordance with the present invention. Only a quarter of the gate array is shown for ease of illustration. The gate array is formed on semiconductor chip 11 and has a plurality of pads 12 positioned around the periphery of chip 11 for receiving input signals, output signals, or supply voltages. The number of pads 12 shown is only representative and the number may vary from one type of gate array to another. At least one pad is available for receiving a supply voltage $V_{CC}$, at least one pad is available for receiving a supply voltage $V_{EE}$, and at least one pad is available for receiving a data input signal D. A plurality of cells $13_{11}$ through $13_{xy}$ are positioned in a matrix on chip 11 where x and y are integers and represent the number of columns and rows, respectively. The plurality of cells can be further divided into subpluralities of cells wherein, for example, a portion of cells is comprised of cells $13_{11}$ through $13_{1y}$ and the remaining portion of cells comprise cells $13_{21}$ through $13_{xy}$. Metallization 14 is placed on the chip with any one of a number of processes well known to those skilled in the art and is coupled between regulator 15 and at least one device in each of selected cells $13_{11}$ through $13_{xy}$ as described hereinafter for supplying a current source voltage $V_{CS}$ thereto. Metallization 14 includes metallization strips $16_1$ through $16_y$ and metallization strips $17_2$, $17_3$, $17_4$, $17_5$, $17_6$ and $17_y$. Metallization 14 and metallization strips $16_1$ through $16_y$ conduct the current source voltage $V_{CS}$, and metallization strips $17_2$, $17_3$, $17_4$, $17_5$, $17_6$ and $17_y$ conduct a current source voltage $V_{CSP}$. Current source voltages $V_{CS}$ and $V_{CSP}$ are applied to current source transistors that source current to devices within each cell of the gate array. This voltage is needed by each cell to perform its required function. When this voltage is removed from a particular cell, that cell is effectively powered down, i.e., no current will flow through the cell even though supply voltages may be present. Additional metallization patterns (not shown) are placed on the chip for connecting transistors and resistors within each cell into Small Scale Integrated logic functions, which take the form of standard logic elements such as dual type "D" flip-flops, dual full adders, guad latches, and many other predefined functions. These cells are also interconnected by the metallizatin to form the desired LSI design and are connected to pads 12 by the metallization for receiving input signals and supply voltages and transmitting output signals. More specifically as shown in FIG. 1, metallization lines 8, 9, and 10 depict the connection of a data input signal D, suppy voltage $V_{EE}$, and supply voltage $V_{CC}$, respectively, to the cells. Power down circuit 21, as illustrated in FIG. 2, is located in each of cells $13_{12}$, $13_{13}$, $13_{14}$, $13_{15}$, $13_{16}$, and $13_{1y}$ and selectively provides current source voltage $V_{CSP}$ to metallization strips $17_2$, $17_3$, $17_4$, $17_5$, $17_6$ and $17_y$ that is substantially similar to current source voltage $V_{CS}$ applied to metallization strips $16_2$, $16_3$, $16_4$, $16_5$, $16_6$ and $16_y$ in response to a data input signal D applied to one of pads 12.

Figure 2:
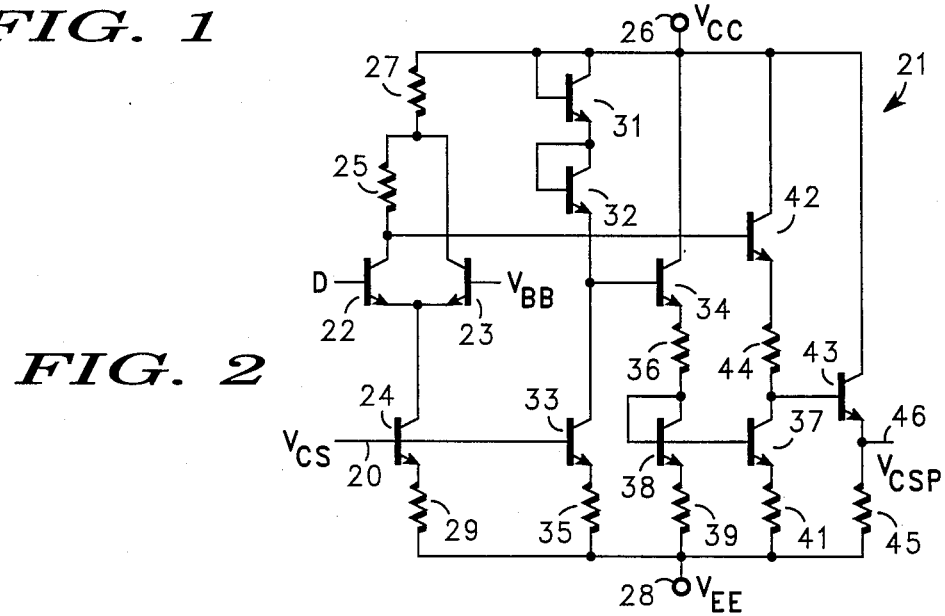
FIG. 2 is a schematic of a circuit within at least one of the cells.

Referring to FIG. 2, power down circuit 21 includes differentially connected transistors 22 and 23 having their emitters connected to the collector of current source transistor 24, and their bases coupled for receiving data input signal D and reference voltage $V_{BB}$, respectively. The collector of transistor 23 is coupled to the collector of transistor 22 by resistor 25 and is coupled to supply voltage terminal 26 by resistor 27. Transistor 24 has a base connected to terminal 20 (for example, metallization $16_2$ of FIG. 1) for receiving current source voltage $V_{CS}$ and an emitter coupled to supply voltage terminal 28 by resistor 29. Transistors 22 and 23 function as a logic gate responsive to data input signal D having logic signals available at the collectors of transistors 22 and 23 that are a function of the data input signal D.

Diode connected transistor 31 has a base and collector connected to supply voltage terminal 26 and an emitter connected to the base and collector of diode connected transistor 32. The emitter of transistor 32 is connected to the collector of current source transistor 33 and the base of transistor 34. Transistor 33 has a base coupled for receiving current source voltage $V_{CS}$ and an emitter coupled to supply voltage 28 by resistor 35. Diode connected transistors 31 and 32 set the voltage level at the base of transistor 34. Transistor 34 has a collector connected to supply voltage terminal 26 and an emitter coupled by resistor 36 both to the the base of transistor 37 and the base and collector of diode connected transistor 38. The emitters of transistors 38 and 37 are coupled to supply voltage terminal 28 by resistors 39 and 41, respectively. Transistors 31, 32, 33, 34, and 38 function as a voltage regulator biased by current source voltage $V_{CS}$ for setting the voltage at the base of transistor 37.

Transistor 42 has a base connected to the collector of transistor 22 and is thereby responsive to data input signal D, a collector connected to supply voltage terminal 26, and an emitter coupled to the base of transistor 43 and the collector of transistor 37 by resistor 44. Transistor 43 has a collector connected to supply voltage terminal 26 and an emitter both connected to terminal 46 (for example, metallization $17_2$ of FIG. 1) for supplying current source voltage $V_{CSP}$ and coupled by resistor 45 to supply voltage terminal 28. The value of the resistance of resistor 45 is set with respect to the load expected on terminal 46. The size of transistor 43 is adjusted likewise to maintain proper matching ratios with other transistors.

The circuit of FIG. 2 supplies a current source voltage $V_{CSP}$ to terminal 46 substantially similar to current source voltage $V_{CS}$ as applied to terminal 20 when data input signal D as applied to the base of transistor 22 is in a logical low state. Current source voltage $V_{CSP}$ tracks voltage $V_{CS}$ over supply voltage variations and temperature. This tracking is achieved by matching of devices and current densities within transistors and cancellation of temperature and power supply terms. Current source voltage $V_{CS}$ is 1.5 $V_{BE}$ above supply voltage $V_{EE}$, where one $V_{BE}$ is a base-emitter voltage of about 0.8 volts. The data gate comprising transistors 22 and 23 have voltages thereacross that are a function of $V_{CC}$. Terminal 46 ($V_{CSP}$) has a voltage swing of 0.5 to 1.5 $V_{BE}$ above $V_{EE}$ as dictated by the data gate. Resistor 27 has a voltage drop of 0.5 $V_{BE}$ and resistor 25 (being twice the resistance of resistor 27) has a voltage drop of 1.0 $V_{BE}$. Therefore, the voltage swing on the base of transistor 42 is 0.5 to 1.5 $V_{BE}$ down from $V_{CC}$ and the voltage swing on the emitter of transistor 42 is 1.5 to 2.5 $V_{BE}$ down from $V_{CC}$. The regulator current mirror comprising transistors 37 and 38 insures that the collector current of transistors 37 and 38 are equal. The voltage at the emitter of transistor 34 is 3.0 $V_{BE}$ below $V_{CC}$ due to the voltage drop across transistors 31, 32 and 34. The resistance of resistors 36, 39 and 41 are equal with a voltage drop equal to one-half the difference of the voltage at terminal 26 minus the voltage at terminal 28 minus 4.0 $V_{BE}$ (the base-emitter voltages of transistors 31, 32, 34, and 38). The resistance of resistor 44 is twice that value with a voltage drop equal to twice that of resistors 36, 39, and 41. Therefore, assuming the voltage difference between terminals 26 and 28 to be 4.0 volts, the voltage at the base and emitter of transistor 43 is 2.5 to 3.5 and 3.5 to 4.5 $V_{BE}$ below $V_{CC}$, respectively. As supply voltage $V_{EE}$ varies, the voltage across resistors 36, 39 and 41 will vary but half that amount with the voltage across resistor 44 varying by the same amount as $V_{EE}$. Since the voltage across resistor 44 varies as supply voltage $V_{EE}$ varies, current source voltage $V_{CSP}$ is referenced to supply voltage $V_{EE}$ and varies between 0.5 and 1.5 $V_{BE}$ above $V_{EE}$.

Circuit 21 is located in cells $13_{12}$, $13_{13}$, $13_{14}$, $13_{15}$, $13_{16}$ and $13_{1y}$ for the gate array shown in FIG. 1. Terminal 20 may comprise anyone of metallization strips $16_2$, $16_3$, $16_4$, $16_5$, $16_6$, or $16_y$ and terminal 46 may comprise any one of metallization strips $17_2$, $17_3$, $17_4$, $17_5$, $17_6$, or $17_y$. The remaining cells in rows $13_{12}$, $13_{13}$, $13_{14}$, $13_{15}$, $13_{16}$ and $13_{1y}$ receive current source voltage $V_{CSP}$ of 1.5 $V_{BE}$ above $V_{EE}$ only when data input signal D is in a low state. When current source voltage $V_{CSP}$ is at a value of 0.5 $V_{BE}$ above $V_{EE}$, not enough margin is available for the cell current sources to function, thus those cells are effectively powered down, i.e., no current will flow through the cell even though supply voltages may be present.

It is seen that current source voltage $V_{CS}$ from regulator 15 is provided to each of cell rows 1 and 7. Therefore, each of the cells in those rows receive a current source voltage $V_{CS}$ throughout the operation of the gate array. This is provided by a normal cell, or dummy cell being placed in the first column with metallization $16_1$ and $16_7$ being continuous across the row. All normal cells are provided with this metal strap. Also, all unused cells in the first column have a dummy cell placed in them to insure array operation.

The actual cells containing circuit 21 may be selected by the person designing the gate array; therefore, the gate array may be designed so that any number of rows in any sequence may be powered down. It is easily seen that the gate array could be designed wherein columns could be powered down in a similar fashion.

By now it should be appreciated that there has been provided a gate array in which portions of the gate array may be powered down when not in use.

I claim:

1. An integrated circuit device formed on a semiconductor chip, comprising:
   a plurality of pads;
   a first plurality of cells, each of said cells coupled to at least one of said plurality of pads;
   a second plurality of cells, each of said cells coupled to at least one of said plurality of pads, each of said cells comprising a plurality of first semiconductor devices interconnected to form a logic circuit; and
   first means comprising second semiconductor devices within each of said first plurality of cells, said first means coupled to different groups of said second plurality of cells for selectively enabling at least one of said different groups of said second plurality of cells, wherein substantially no current flows in the unselected groups of cells.

2. The integrated circuit device according to claim 1 wherein said first means comprises:
   second means for supplying a first voltage;
   a power down circuit comprising said second semiconductor devices within each of said first plurality of cells and coupled to said second means for receiving said first voltage and for selectively providing a second voltage substantially equal to said first voltage to at least one of said groups of said second plurality of cells.

3. The integrated circuit device according to claim 2 wherein said power down circuit comprises:
   a first supply voltage terminal coupled to a first of said plurality of pads;
   a second supply voltage terminal coupled to a second of said plurality of pads;
   third means coupled between said first and second supply voltage terminals and to a third of said plurality of pads for providing a logic signal in response to an input signal applied to said third pad;
   fourth means coupled between said first and second supply voltage terminals and coupled to said second means for receiving said first voltage and providing a regulated bias voltage based on said first voltage; and
   fifth means coupled between said first and second supply voltage terminals and coupled to said third and fourth means for providing said second voltage in response to said logic signal, said fifth means being biased by said regulated bias voltage.

4. The integrated circuit device according to claim 3 wherein said fourth means comprises:
   sixth means for providing a resistance;
   seventh means for providing a resistance;
   eighth means for providing a resistance;
   ninth means for providing a resistance;
   a first transistor having a base coupled to said second means for receiving said first voltage, an emitter coupled to said second supply voltage terminal by said sixth means, and a collector coupled to said first supply voltage terminal by said seventh means;
   a second transistor having a base coupled to said collector of said first transistor, a collector coupled to said first supply voltage terminal, and an emitter; and
   a third transistor having an emitter coupled to said second supply voltage terminal by said eighth means, and a base and collector coupled to said emitter of said second transistor by said ninth means and to said fifth means.

5. The integrated circuit device according to claim 4 wherein said fifth means comprises:
   tenth means for providing a resistance;
   eleventh means for providing a resistance;
   twelfth means for providing a resistance;
   a fourth transistor having a base coupled to said third means for receiving said logic signal, a collector coupled to said first supply voltage terminal, and an emitter;
   a fifth transistor having a base coupled to said base and collector of said third transistor, an emitter coupled to said second supply voltage terminal by said tenth means, and a collector coupled to said emitter of said fourth transistor by said eleventh means; and
   a sixth transistor having a base coupled to said collector of said fifth transistor, a collector coupled to said first supply voltage terminal, and an emitter coupled to said second supply voltage terminal by said twelfth means for providing said second voltage.

6. The integrated circuit device according to claim 5 wherein said third means comprises:
   thirteenth means for providing a resistance;
   fourteenth means for providing a resistance;
   a seventh transistor having a base coupled to said third pad, a collector coupled to said first supply voltage terminal by said thirteenth means, and an emitter;
   an eighth transistor having a base coupled for receiving a reference voltage, a collector coupled to said first supply voltage terminal by said thirteenth means, and an emitter coupled to said emitter of said seventh transistor, wherein said collector of one of said seventh and eighth transistors is coupled to said base of said fourth transistor; and
   a ninth transistor having a base coupled to said second means for receiving said first voltage, a collector coupled to said emitters of said seventh and eighth transistors, and an emitter coupled to said second supply voltage terminal by said fourteenth means.

7. The integrated circuit device according to claim 6 wherein said third means further comprises fifteenth means for providing a resistance coupled between said collector of said seventh transistor and said thirteenth means.

8. A large scale integrated array comprising:
a plurality of cells, including first and second portions, arranged in a matrix of rows and columns, each of said first portion of plurality of cells comprising a plurality of first semiconductor devices interconnected to form a circuit;
a plurality of pads;
a plurality of first means, each for supplying a first voltage;
at least one second means comprising second semiconductor devices, each of said second means located within one of said cells of said second portion of plurality of cells and coupled to at least one of said plurality of pads and between one of said first means and a group of said cells of said first portion of plurality of cells for receiving said first voltage and selectively supplying a second voltage substantially similar to said first voltage to said group of said first portion of plurality of cells, for selectively enabling said group of said first portion of plurality of cells.

9. The large scale integrated array according to claim 8 wherein said second means comprises:
a first supply voltage terminal coupled to a first of said plurality of pads;
a second supply voltage terminal coupled to a second of said plurality of pads;
third means coupled between said first and second supply voltage terminals and to a third of said plurality of pads for providing a logic signal in response to an input signal applied to said third pad;
fourth means coupled between said first and second supply voltage terminals and coupled to one of said first means for receiving said first voltage and providing a regulated bias voltage based on said first voltage; and
fifth means coupled between said first and second supply voltage terminals and coupled to said third and fourth means for providing said second voltage in response to said logic signal, said fifth means being biased by said regulated bias voltage.

10. The large scale integrated array according to claim 9 wherein said fourth means comprises:
sixth means for providing a resistance;
seventh means for providing a resistance;
eighth means for providing a resistance;
ninth means for providing a resistance;
a first transistor having a base coupled to said first means for receiving said first voltage, an emitter coupled to said second supply voltage terminal by said sixth means, and a collector coupled to said first supply voltage terminal by said seventh means;
a second transistor having a base coupled to said collector of said first transistor, a collector coupled to said first supply voltage terminal, and an emitter; and
a third transistor having an emitter coupled to said second supply voltage terminal by said eighth means, and a base and collector coupled to said emitter of said second transistor by said ninth means and to said fifth means.

11. The large scale integrated array according to claim 10 wherein said fifth means comprises:
tenth means for providing a resistance;
eleventh means for providing a resistance;
twelfth means for providing a resistance;
a fourth transistor having a base coupled to said third means for receiving said logic signal, a collector coupled to said first supply voltage terminal, and an emitter;
a fifth transistor having a base coupled to said base and collector of said third transistor, an emitter coupled to said second supply voltage terminal by said tenth means, and a collector coupled to said emitter of said fourth transistor by said eleventh means; and
a sixth transistor having a base coupled to said collector of said fifth transistor, a collector coupled to said first supply voltage terminal, and an emitter coupled to said second supply voltage terminal by said twelfth means for providing said second voltage.

12. The large scale integrated array according to claim 11 wherein said third means comprises:
thirteenth means for providing a resistance;
fourteenth means for providing a resistance;
a seventh transistor having a base coupled to said third pad, a collector coupled to said first supply voltage terminal by said thirteenth means, and an emitter;
an eighth transistor having a base coupled for receiving a reference voltage, a collector coupled to said first supply voltage terminal by said thirteenth means, and an emitter coupled to said emitter of said seventh transistor, wherein said collector of one of said seventh and eighth transistors is coupled to said base of said fourth transistor; and
a ninth transistor having a base coupled to said first means for receiving said first voltage, a collector coupled to said emitters of said seventh and eighth transistors, and an emitter coupled to said second supply voltage terminal by said fourteenth means.

13. The large scale integrated array according to claim 12 wherein said third means further comprises fifteenth means for providing a resistance coupled between said collector of said seventh transistor and said thirteenth means.

14. An improved monolithically integrated array having a plurality of pads, a plurality of cells including a first portion and a second portion, each of said cells including a first and second plurality of semiconductor devices, respectively, a plurality of regulators, each of said regulators supplying a first current source voltage to said first portion of said cells, wherein the improvement comprises:
a plurality of metallization patterns including a first pattern and a second pattern, each of said first patterns coupled between one of said plurality of regulators and said first portion of said plurality of cells for conducting said first current source voltage; and
at least one first means comprising said first plurality of semiconductor devices, each of said first means located within one of said first portion of plurality of cells and coupled by said first pattern to one of said regulators for receiving said first current source voltage and coupled to at least one cell in said second portion by said second pattern for selectively supplying a second current source voltage substantially similar to said first current source voltage to said at least one cell, wherein said at least one cell will be disabled when said second current source voltage is removed and substantially no current will flow in said cell.

15. The monolithically integrated array according to claim 14 wherein said first means comprises:
a first supply voltage terminal coupled to a first of said plurality of pads;
a second supply voltage terminal coupled to a second of said plurality of pads;
second means coupled between said first and second supply voltage terminals and to a third of said plurality of pads for providing an logic signal in response to an input signal applied to said third pad;
third means coupled between said first and second supply voltage terminals and coupled to said first pattern for receiving said first current source voltage for providing a regulated bias voltage based on said first current source voltage; and
fourth means coupled between said first and second supply voltage terminals and coupled to said second and third means for providing said second current source voltage in response to said logic signal, said fourth means being biased by said regulated bias voltage.

16. The monolithically integrated array according to claim 15 wherein said third means comprises:
fifth means for providing a resistance;
sixth means for providing a resistance;
seventh means for providing a resistance;
eighth means for providing a resistance;
a first transistor having a base coupled to said first pattern for receiving said first current source voltage, an emitter coupled to said second supply voltage terminal by said fifth means, and a collector coupled to said first supply voltage terminal by said sixth means;
a second transistor having a base coupled to said collector of said first transistor, a collector coupled to said first supply voltage terminal, and an emitter; and
a third transistor having an emitter coupled to said second supply voltage terminal by said seventh means, and a base and collector coupled to said emitter of said second transistor by said eighth means and to said fourth means.

17. The monolithically integrated array according to claim 16 wherein said fourth means comprises:
ninth means for providing a resistance;
tenth means for providing a resistance;
eleventh means for providing a resistance;
a fourth transistor having a base coupled to said second means for receiving said logic signal, a collector coupled to said first supply voltage terminal, and an emitter;
a fifth transistor having a base coupled to said base and collector of said third transistor, an emitter coupled to said second supply voltage terminal by said ninth means, and a collector coupled to said emitter of said fourth transistor by said tenth means; and
a sixth transistor having a base coupled to said collector of said fifth transistor, a collector coupled to said first supply voltage terminal, and an emitter coupled to said second supply voltage terminal by said eleventh means for providing said second voltage.

18. The monolithically integrated array according to claim 17 wherein said second means comprises:
twelfth means for providing a resistance;
thirteenth means for providing a resistance;
a seventh transistor having a base coupled to said third pad, a collector coupled to said first supply voltage terminal by said twelfth means, and an emitter;
an eighth transistor having a base coupled for receiving a reference voltage, a collector coupled to said first supply voltage terminal by said twelfth means, and an emitter coupled to said emitter of said seventh transistor, wherein said collector of one of said seventh and eighth transistors is coupled to said base of said fourth transistor; and
a ninth transistor having a base coupled to said first pattern for receiving said first current source voltage, a collector coupled to said emitters of said seventh and eighth transistors, and an emitter coupled to said second supply voltage terminal by said thirteenth means.

19. The monolithically integrated array according to claim 18 wherein said third means further comprises fourteenth means for providing a resistance coupled between said collector of said seventh transistor and said twelfth means.

* * * * *